(12) United States Patent
Carlsson et al.

(10) Patent No.: US 8,599,054 B2
(45) Date of Patent: Dec. 3, 2013

(54) METHOD FOR USING A SENSOR SYSTEM HAVING A SINGLE-BIT QUANTIZER AND A MULTI-BIT FEEDBACK LOOP

(75) Inventors: Mats Carlsson, Sundbyberg (SE); David Westberg, Uppsala (SE); Gert Andersson, Lindome (SE); Nils Hedenstierna, Västra Frølunda (SE); Sjoerd Haasl, Stockholm (SE)

(73) Assignee: PGS Geophysical AS, Oslo (NO)

( * ) Notice: Subject to any disclaimer, the term of this patent is extended or adjusted under 35 U.S.C. 154(b) by 4 days.

(21) Appl. No.: 13/366,937

(22) Filed: Feb. 6, 2012

(65) Prior Publication Data

US 2012/0229317 A1 Sep. 13, 2012

Related U.S. Application Data

(60) Provisional application No. 61/451,144, filed on Mar. 10, 2011.

(51) Int. Cl.
*H03M 3/00* (2006.01)

(52) U.S. Cl.
USPC .......................................... 341/143; 341/155

(58) Field of Classification Search
USPC .................................................. 341/143, 155
See application file for complete search history.

(56) References Cited

U.S. PATENT DOCUMENTS

| | | | |
|---|---|---|---|
| 7,155,979 B2 * | 1/2007 | Lasalandra et al. | 73/514.18 |
| 7,456,770 B2 * | 11/2008 | Cairns | 341/143 |
| 7,479,910 B1 * | 1/2009 | Heinks et al. | 341/143 |
| 7,898,448 B2 * | 3/2011 | Murakami et al. | 341/143 |
| 8,300,116 B2 * | 10/2012 | Kwon et al. | 348/222.1 |
| 2009/0079606 A1 | 3/2009 | Terry et al. | |

OTHER PUBLICATIONS

Daniel Rocha, PCT International Search Report and Written Opinion, Mailing Date: Aug. 27, 2012.
Francisco Colodro, et al., "Continuous—Time Sigma—Delta Modulator with a Fast Tracking Quantizer and Reduced Number of Comparators",Sep. 1, 2010, XP011305403 .. p. 2413-2425.
Clemens M. Zierhofer, "Adaptive Sigma—Delta Modulation with One-Bit Quantization", May 1, 2000, XP11013230, p. 408-415, Fig 3.
C. Lang, et al., "A Low Noise Accelerometer with Digital PID-Type Controller and Multibit Force Feedback", Sep. 21, 1999, XP031895683, p. 250-253, Fig 1,2.
Tetsuya Kajita, et al., "A Two-Chip Interface for a MEMS Accelerometer", Aug. 1, 2002, XP011073955, p. 853-858.
Jiangfeng Wu, et al.,"Electromechanical'ΔΣ Modulation with High-Q Micromechanical Accelerometers and Pulse Density Modulated Force Feedback", Feb. 1, 2006, XP55035610,p. 274-287.

* cited by examiner

*Primary Examiner* — Brian Young

(57) ABSTRACT

A modulator is provided in operative engagement with a sensor element having a plurality of electrodes. The modulator has a single-bit quantizer electrically connected to a digital accumulator. The accumulator accumulates output information received from the single-bit quantizer. The accumulator converts the accumulated output information received from the single-bit quantizer to a multi-bit feedback signal and sends the multi-bit feedback signal in a primary feedback loop back to the sensor element. The quantizer sends a single-bit feedback signal in a secondary feedback loop back to a point before the quantizer.

20 Claims, 7 Drawing Sheets

| Parameter | Condition | Min | Typ | Max | Unit |
|---|---|---|---|---|---|
| Mass | | | 8.16 | | mg |
| Area | Total electrode area | | 5.0 | | mm² |
| Conversion gain | | | 10 | | pF/g |
| First resonance frequency | | | 706 | | Hz |
| Q | 1000 *$f_{resonance}$/1700 | | 415 | | |
| Mass capacitor, $C_0$ | Total capacitance per plate | | 30 | | pF |

METHOD FOR USING A SENSOR SYSTEM HAVING A SINGLE-BIT QUANTIZER AND A MULTI-BIT FEEDBACK LOOP

This application claims the benefit of U.S. Provisional Application No. 61/451,144, filed Mar. 10, 2011, the entire contents of which are hereby incorporated by reference as if fully set forth herein,

TECHNICAL FIELD

The invention relates to a method for using a sensor system having a single-bit quantizer and a multi-bit feedback loop.

BACKGROUND OF INVENTION

High performance sensor systems are typically based on closed loop architectures to provide good linearity and large dynamic range. Systems typically use sigma-delta modulated single-bit feedback and let the sensing element act as a loop filter. A voltage driven micro-machined inertial sensor acts as a second order low pass filter where one order comes from the voltage to force (charge) conversion and the other order from force to displacement which is what is detected. FIG. 1 is an illustrative example of a prior art system 10 of a second order accelerometer system. The prior art technology of FIG. 1 limits the noise-shaping order of the system to two. One drawback is that the system 10 requires a large over-sampling ratio to achieve low in-band quantization noise density. A large over-sampling ratio drives up the power consumption mainly due to the charging and discharging of the force capacitors. The high-frequency phase-shift of the sensing element is close to 180 degrees. Therefore, a power-consuming phase compensating lead-lag is required to guarantee stability of the system. In most applications, e.g. battery operated, the power consumption can be equally or even more important than the signal-to-noise ratio.

The required over-sampling ratio can be decreased by adding electrically determined poles to the transfer function of the system which increases the noise shaping order. The systems create a fifth order system by introducing three electrical poles. They still use single-bit feedback to the sensing element and they also make use of a phase compensating filter to ensure stability.

The prior art systems use single-bit feedback. Single-bit noise shapers possess two attractive properties namely simplicity and linearity. It is significantly easier to build a single-bit quantizer than a multi-bit quantizer both in terms of quantization levels and power consumption. A single-bit feedback system is inherently more linear than a multi-bit system since mismatch of the feedback signal is no issue with only two levels. However, single-bit feedback systems are always be a compromise between quantization of the noise performance and the over-sampling ratio, i.e. power consumption. There is a need for a more effective system that operates reliably without suffering from the drawbacks described above.

SUMMARY OF INVENTION

The method of the present invention provides a solution to the above-outlined problems. More particularly, a multi-bit sigma-delta modulator is provided in operative engagement with a sensor element that has a plurality of electrodes. The modulator has a single-bit quantizer electrically connected to a digital accumulator. The accumulator accumulates output information received from the single-bit quantizer. The accumulator converts the accumulated output information received from the single-bit quantizer to a multi-bit feedback signal and sends the multi-bit feedback signal in a primary feedback loop back to the sensor element. The quantizer sends a single-bit feedback signal in a secondary feedback loop back to a point before the quantizer.

DETAILED DESCRIPTION

Figure 1:
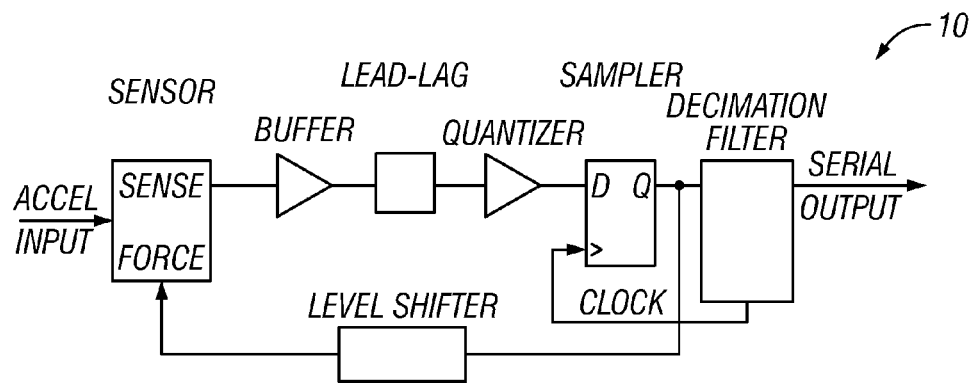
FIG. 1 is a schematic view of a block diagram of the second order accelerometer system of a prior art system.
Figure 2:
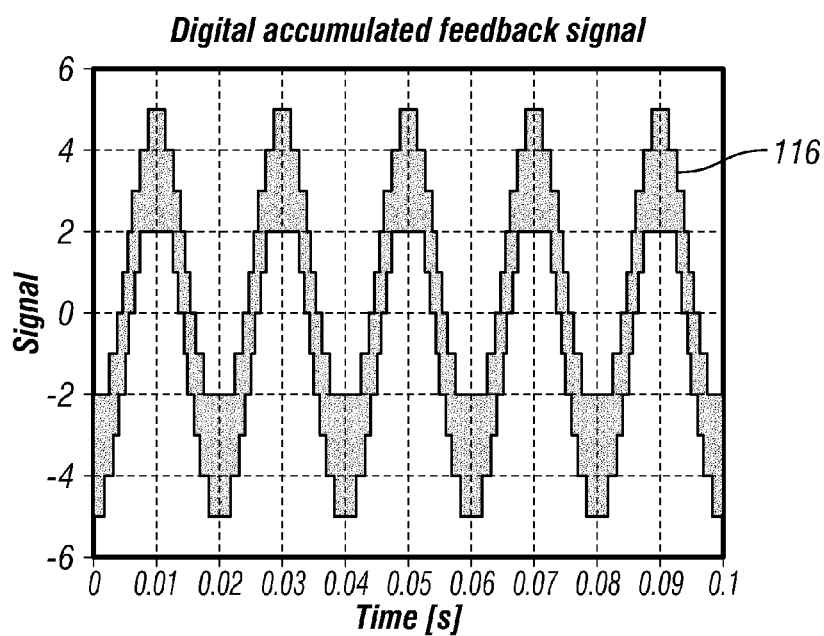
FIG. 2 is a schematic view of a digital accumulator output for a large sensor input signal of the present invention wherein a 2 g, 50 Hz acceleration is applied.
Figure 3:
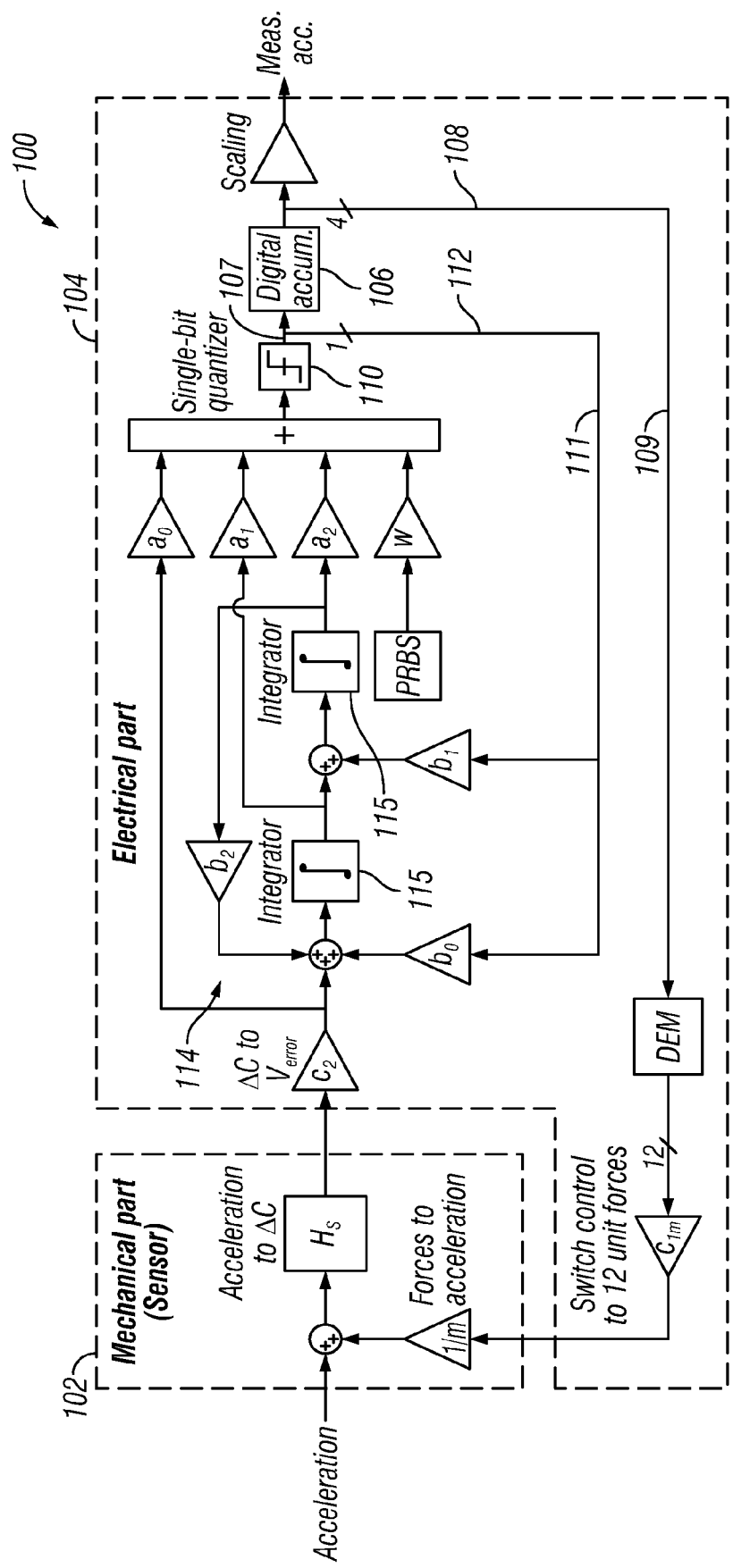
FIG. 3 is a schematic view of two feedback paths of the present invention wherein the primary feedback loop cancels the applied input signal while the secondary loop facilitates noise shaping and stability.
Figures 4, 5:
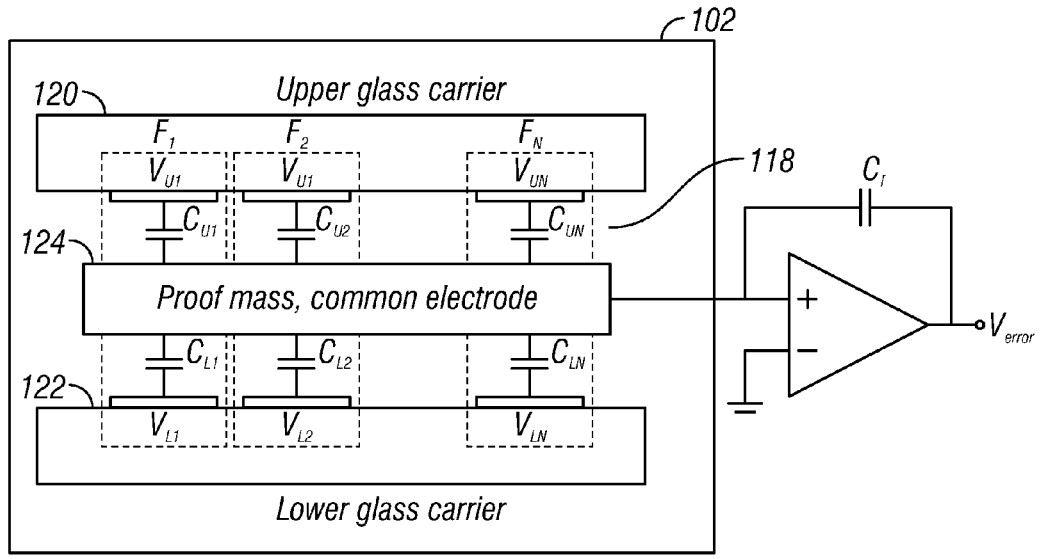
FIG. 4 is a schematic view of a unit force DAC sensor and an error signal generation of the present invention.
FIG. 5 is a table showing typical sensing element parameters.

With reference to FIGS. 2-4, the sensor system 100 (best seen in FIG. 3) of the present invention has a sensor architecture that makes it possible to combine high performance with low power consumption. It has been surprisingly discovered that the combination of using a multi-bit primary feedback loop back to the sensor element in combination with a single-bit secondary feedback loop back to the electrical part provide an effective high-performance stable sensor system that requires a very low power consumption. The application of the present invention to an accelerometer is only used as an illustrative example to describe the features of the present invention and the sensor system is not limited to accelerometer applications. For example, the sensor system could be used in computer games for mobile computers so that the game is displayed in a certain direction regardless of whether the user turns the mobile computer or not. The mobile computer may use a built-in accelerometer to measure the acceleration of the movement of the earth such as gravitational forces relative to the movement of the mobile computer. Another preferred use of the invention is sensing for seismic exploration and surveillance there large number of sensor over large areas are needed and low energy consumption is a must for battery powering or manageable power cabling.

The sensing element 102, such as an inertial sensor, may be included as an integral part of an integrated circuit of an electrical part such as a multi-bit sigma-delta modulator 104. Digital accumulation of quantizer output in a digital accumulator 106 achieves a multi-bit primary feedback 108 with a single-bit quantizer 110. In other words, the accumulator 106 converts the accumulated single-bit output information received from the single-bit quantizer 110 to a multi-bit feedback signal and sending the multi-bit feedback signal 109 in a delayed primary feedback loop 108 back to the sensor element.

The feedback 108 to the sensing element provides low noise and large dynamic range. To compensate for the relatively infrequent feedback signal 109, single-bit feedback signal/information 111 is sequentially and preferably continuously sent in the secondary feedback loop 112 as each single bit of signal information 107 is received from the single-bit quantizer 110 directly into a electrical loop filter 114 to enhance stability making it possible to eliminate the need for phase compensating filters. It is thus better for the some of preliminary information at a higher frequency in feedback 112 about the position of the proof mass 124 to compensate for the delay and to preliminarily anticipate the change of the feedback signal 109 in feedback loop 108 although the single-bit information 111 in feedback loop 112 may not be as precise and the information of the feedback signal 109 in the primary feedback loop 108. In other words, since the delay in the feedback loop 108 may be significant, the actual position of, for example, the proof mass 124 may have changed too much during the delay so that the sensor system may have very incorrect and old information. By using the very frequent information in the feedback loop 112, the information that goes into the quantizer 110 can be preliminarily corrected, such as some preliminary information about the position of the proof mass 124, while waiting for the more correct but relatively infrequent feedback signal 109 of feedback loop 108. The information in the feedback loop 112 is used and accumulated in the integrators 115 of the modulator 104 so that the integrators in a way operate like digital accumulators. The information such as current information, in the feedback loop 112 may be subject to weighting factors b0, b1 and b2 as shown in FIG. 3 before the information is received in the integrators.

As explained in detail below, a unit force digital-to-analog converter (DAC) 118 is disposed in the feedback branch. A multi-level force is created by splitting the electrodes into several smaller units and driving them individually.

One important feature of the present invention is the digital accumulation in the digital accumulator 106 of the output information 107 received from the single-bit quantizer 110. To achieve really low power-consumption, the electrical loop filter and quantizer need to be as simple as possible. It is therefore advantageous to use a single-bit quantizer 110 due to the low power-consumption. However, the signal being fed back to the sensing element 102 is preferably a multi-level signal in the multi-bit primary feedback 108 to reduce the quantization noise and to increase the large signal handling. Therefore, one feature of the present invention is to use the single-bit quantizer 110 and to generate a multi-bit feedback control value by digitally integrating the quantifier output of the sinusoidal acceleration movement, as seen in FIG. 2, FIG. 2 thus illustrates a digital accumulated feedback signal 116 of the primary feedback loop 108 as the digital accumulator output for a large sensor input signal. In the illustrated example, the input signal is a 2 g, 50 Hz acceleration that may be applied to an illustrative example based on the parameters described in FIG. 5 which is described in more detail below. The multi-bit control is preferably converted to a corresponding electrostatic force which counteracts the applied acceleration. The moving average of this multi-level signal can be close to the peak value. In a single-bit sigma-delta system the moving average can typically only be driven to half the peak value. This means that the multi-level system makes more efficient use of the available electrostatic force, reducing the required actuator drive voltage, which in turn enables lower power-consumption for the same full scale acceleration, Compared to a multi-bit quantizer, the digital accumulator 106 introduces significant delay of the feedback signal of the feedback 108. It takes several clock cycles to change from full positive feedback to full negative feedback. In other words, the fact that the output signal 107 from the single-bit quantizer 110 must be accumulated in the digital accumulator 106 takes time and makes the frequency or rate of the primary feedback 108 too slow. In conventional sigma-delta modulators such a delay would typically result in an unstable system. The system of the present invention overcomes this stability issue by introducing a secondary feedback loop as seen in FIG. 3. The low latency single-bit quantizer output 107 is fed directly into the electrical loop filter 114 of the forward path/signal of the electronics without going through the digital accumulator 106. An additional important advantage of the secondary feedback loop is that it provides enough stability-margin to make it possible to eliminate the power consuming analog lead-lag filter to compensate for the phase-shift of the sensing element.

Inertial sensors of prior art systems typically have a single pair of actuator electrodes. The most intuitive implementation of a multi-bit feedback force is consequently to control the voltage across this electrode pair. This could be done by driving the electrode pair with an electrical DAC. However, noise or imperfections added in the feedback path of $\Sigma\Delta$-ADCs cannot be suppressed by the loop. The DAC would therefore need to be both linear and have low noise. The method of the present invention, on the other hand, focuses on the total required electrostatic force. This is the quantity that needs multi-bit properties and it can be achieved more efficiently by replacing the commonly large single outer electrodes into several smaller electrodes disposed inside the sensor element 102, as shown in FIG. 4. The plurality of electrodes in the sensor element 102 enables the use of multi-rate primary feedback loop 108, as explained in detail below. The digital-to-analog converter (DAC) 118 may have an upper glass carrier 120 and a lower glass carrier 122 with a proof mass common electrode 124 hanging freely in vacuum therebetween so that it may move relative to the carriers 120 and 122. If the sensor element 102 is moved in one direction such as upwardly, the distance between the proof mass 124 and the carrier 122 will shorten and the distance between the proof mass 124 and the carrier 120 will lengthen. This means the capacitance values will also change since that depends (inversely proportional) upon the distance. This change of the capacitance values may be measured as an error signal that is either plus or minus. In other words, each electrode pair may then create a small unit force, $F_i$ to attempt to pull back the proof mass to the initial resting position. The sign of the unit force depends on the applied voltages $V_{vi}$ and $V_{Li}$. One problem is that the created pull back force, such as a positive force, may be too large so that is must be compensated by a negative force that may also be too large. The forces may then be switched back and forth until the correct pull back forces are applied to the proof mass to bring it back to the initial resting position. By combining several individually controlled unit forces, the total electrostatic force obtains multi-bit properties. In other words, the number of positive unit forces compared to the number of negative forces is adjusted to try to find an accumulated force that is about right to pull back the proof mass to the initial resting position which reduces the total quantizer error and makes it possible to correct the error quicker and reduce the need for sampling speed.

This unit force DAC 118 requires no operational amplifier or other power consuming circuitry. Instead, the DAC 118 is sufficient to have simple switches allowing the outer electrodes to be connected either to ground or supply.

Mismatch of the unit force DAC 118 is preferably mitigated by dynamically selecting which of the unit elements to use for each sample. This technique may be referred to as dynamic element matching and may be used in purely electrical sigma-delta modulated systems. This technique may be applied to electro-mechanical inertial sensors prior to the invention.

Figure 6:
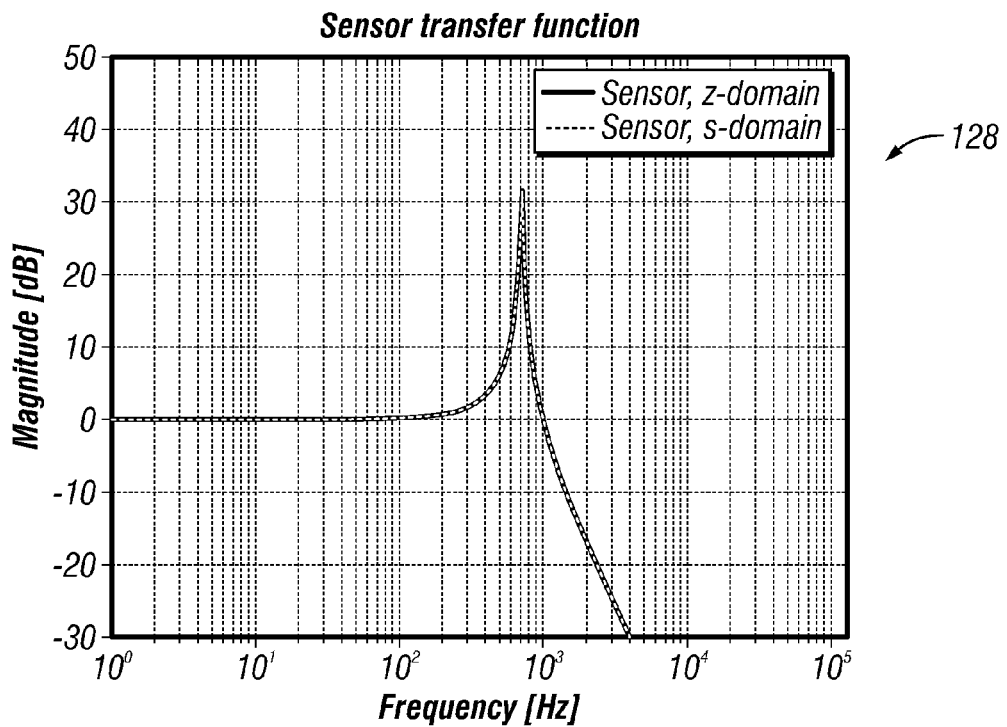
FIG. 6 is a schematic view of a magnitude response of sensor element conversion gain of the present invention.

One application of the present invention that has been carefully investigated is electro-mechanical inertial sensor. With the novel architecture of the present invention it is possible to design an accelerometer with a full scale input of 2 g, close to 130 dB signal-to-noise ratio in 300 Hz bandwidth and a power consumption as low as 3 mW. The required supply voltage may be limited to 5 V. The sample rate could be 256 kHz. Preferably, the sensing element is a bulk micromachined device consisting of a silicon proof mass suspended between two glass plates. The parameters 126 of the sensing element 102 parameters are summarized in FIG. 5 and its sensor transfer function 128 showing a magnitude response of sensor element conversion gain is shown in FIG. 6.

With reference to FIG. 4, electrostatic forces $F_i$ are applied to the proof mass 124 such that forces caused by acceleration and gravity are cancelled and the proof mass 124 remains almost fixed relative to its surrounding electrodes. Minimizing the movement of the proof mass 124 and variation in capacitance improves linearity compared to an open loop system. Displacement of the proof mass 124 relative to its nominal position is monitoring by measuring the error charge generated when the charge is shifted between the upper and lower capacitances. In other words, the acceleration of the proof mass 124 may be measured by monitoring the electrostatic forces $F_i$ required to counteract the acceleration.

Assuming that the proof mass 124 is perfectly centered between the outer glass plates 120, 122 if no force is applied, then the capacitances of the unit elements can be described by equation (1) below:

$$C_{Ui} = C_{0i} + \Delta C_i$$

$$C_{Li} = C_{0i} - \Delta C_i$$

where $C_{0i}$ is the nominal capacitance and $\Delta C_i$ is the capacitance deviation resulting from a net force leading to a displacement of the proof mass since the loop gain of the sensor system is large, the proof mass 124 will be kept close to its nominal position and $\Delta C_i$ can be approximated to be zero. The net electrostatic force on unit i can then be described by equation (2) below:

$$F_t = \frac{2 C_{0i}^2 V_{0i}}{\varepsilon A} \Delta V_i \qquad (2)$$

where $V_{0i}$ and $\Delta V_i$ are described in equation (3) below:

$$V_{0i} = (V_{Ui} + V_{Li})/2$$

$$\Delta V_i = \pm (V_{Ui} - V_{Li})/2$$

When $\Delta V_i$ changes sign, the charge is transferred between the upper and lower capacitors. If $C_{Ui} \neq C_{Vi}$ an error charge will be transferred to $C_f$, resulting in an voltage error signal, $V_{err}$, at the output of the operation amplifier in FIG. 4.

$$V_{error} = Q_{error} / C_f \qquad (4)$$

$$= \frac{4 \Delta C_i}{C_f} \Delta V_i$$

As can he seen from equation (4) above, the error signal depends on the sign of the applied feedback signal $\Delta V_i$. This is not explicitly shown in the block diagrams but this should be accounted for. In a differential design this is straight forward.

Figure 7:
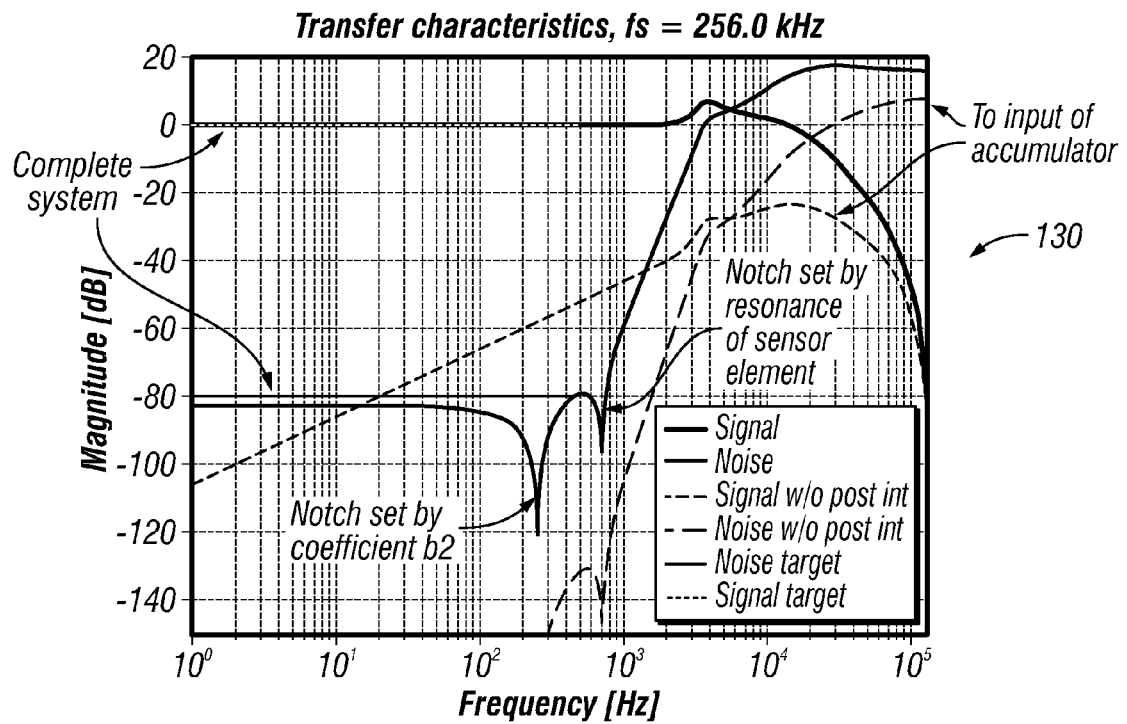
FIG. 7 is a schematic view transfer functions calculated from a linearized system model with an effective quantizer gain of 1.4.

To achieve a low quantization noise level for a larger bandwidth, an electrical resonator has been added, coefficient $b_2$. This creates a notch in the noise transfer function 130 at 250 Hz calculated from a linearized system model with an effective quantizer gain of 1.4, as shown in FIG. 7. The high frequency notch at 706 Hz may be set by the sensor resonance frequency. Preferably, the loop filter has sufficient degrees of freedom to both optimize the signal and noise transfer functions.

Figure 8:
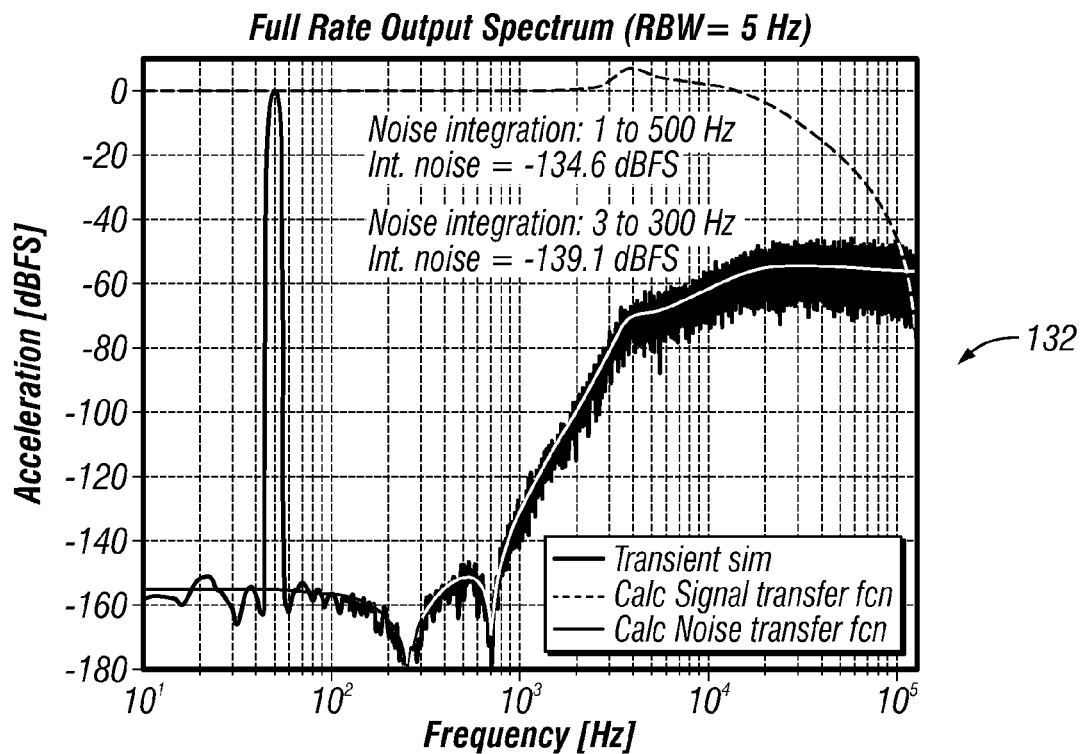
FIG. 8 is a schematic view of a spectrum of a transient simulation of the multi-bit voltage feedback system wherein an input acceleration is a 50 Hz 2 g sinusoidal signal and no kT/C or thermal noise has been added.
Figure 9:
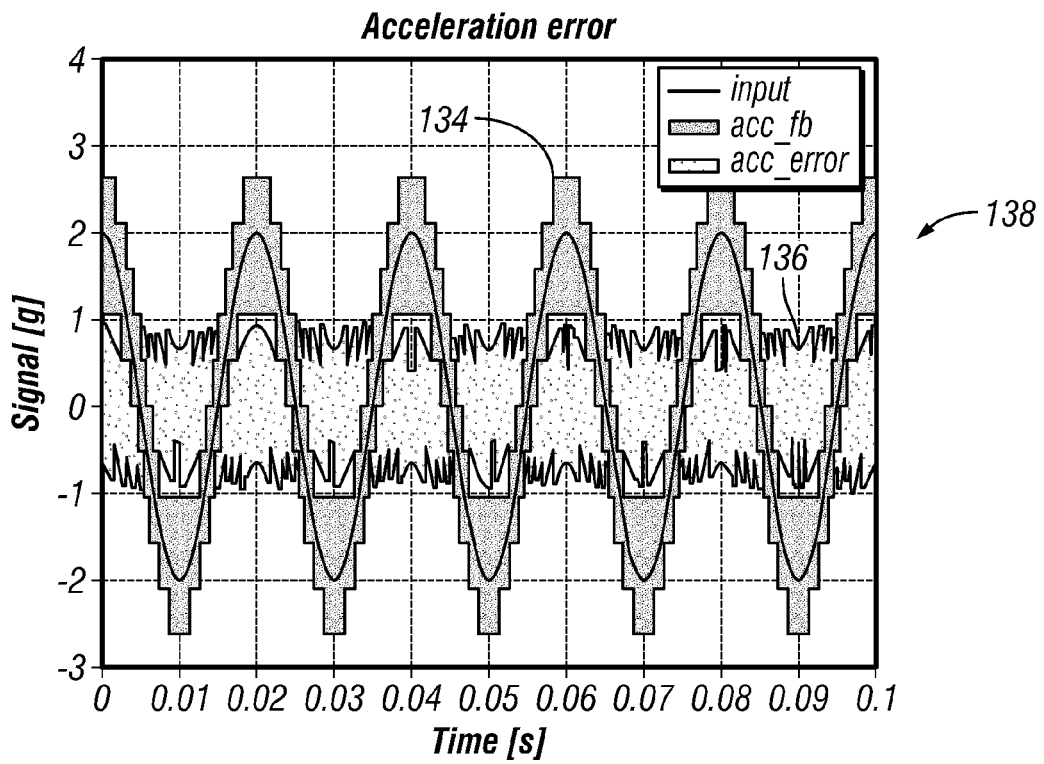
FIG. 9 is a schematic view of an input acceleration, feedback signal and resulting instantaneous acceleration error for a 2 g, 50 Hz signal.
Figure 10:
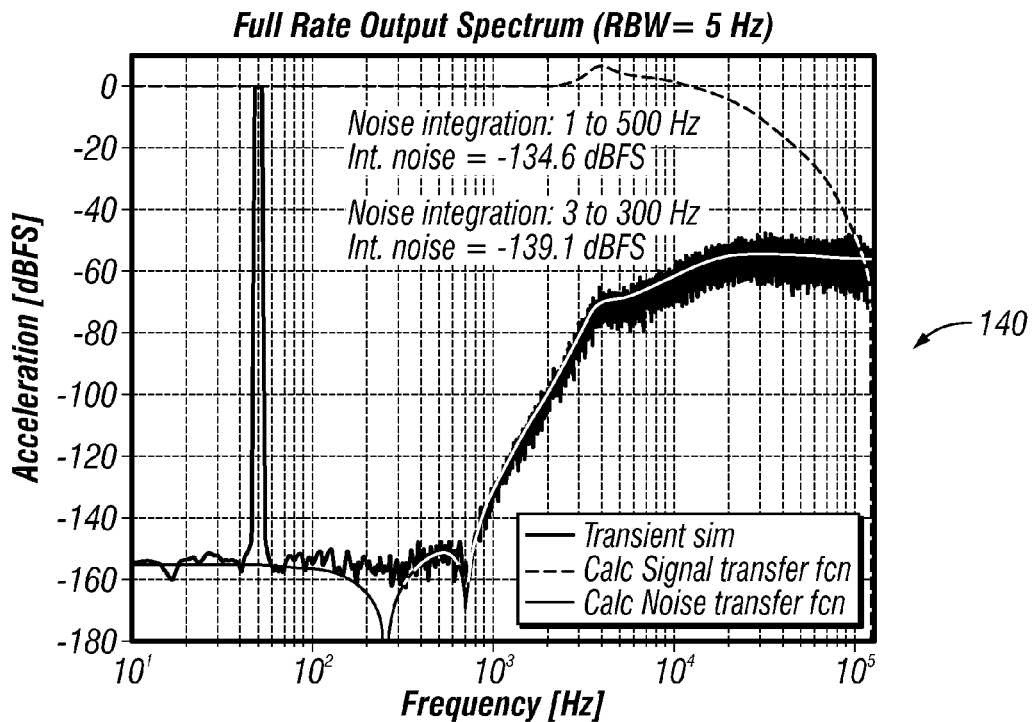
FIG. 10 is a schematic view of a spectrum with applied white noise on a voltage across unit forces wherein the noise density is 18 nV/√Hz which corresponds to 0.4 μV in 500 Hz bandwidth and no mismatch is applied.

The electrical loop filter coefficients may be designed such that full-scale becomes 2 g, but the system can typically handle 1 dB more before it is overloaded and becomes unstable. FIG. 8 shows a spectrum 132 of a transient simulation without noise or DAC mismatch. The spectrum 132 is of a transient simulation of the multi-bit voltage feedback system. The input acceleration is set at 50 Hz 2 g sinusoidal signal. No kT/C or thermal noise is added. The feedback signal 134 and resulting instantaneous acceleration error 136 of such a transient simulation is shown in a diagram 138 in FIG. 9. FIG. 10 shows the simulated spectrum 140 when kT/C noise of the unit force DAC is included. The noise density is 18 nV/√Hz. This corresponds to 0.4 μV in 500 Hz bandwidth and no mismatch is applied.

The unit force DAC 118 (best shown in FIG. 4) may consist of 12 unit elements. The currently implemented DEM is data weighted averaging (DWA), i.e. thermometer coding of the unit forces and rotating the control signals. This creates first order high frequency shaping of the mismatch errors.

Figure 11:
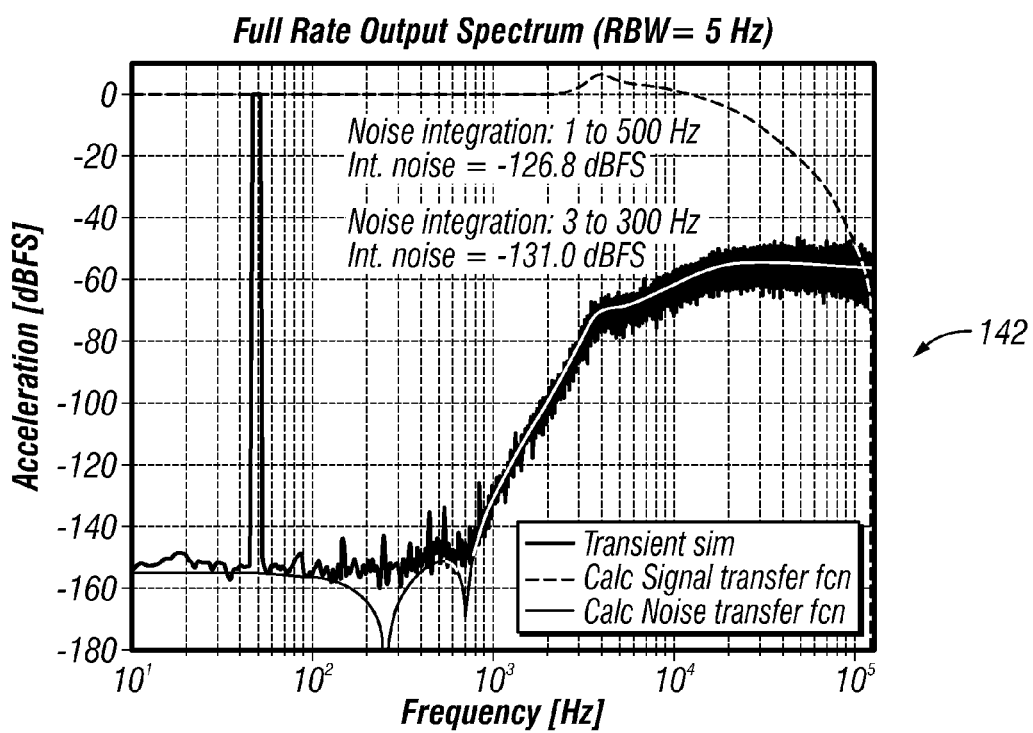
FIG. 11 is a schematic view of a resulting spectrum of a transient simulation with 18 nV/√Hz white noise, 1% (3σ) mismatch and data weighted averaging to mitigate the mismatch.
Figure 12:
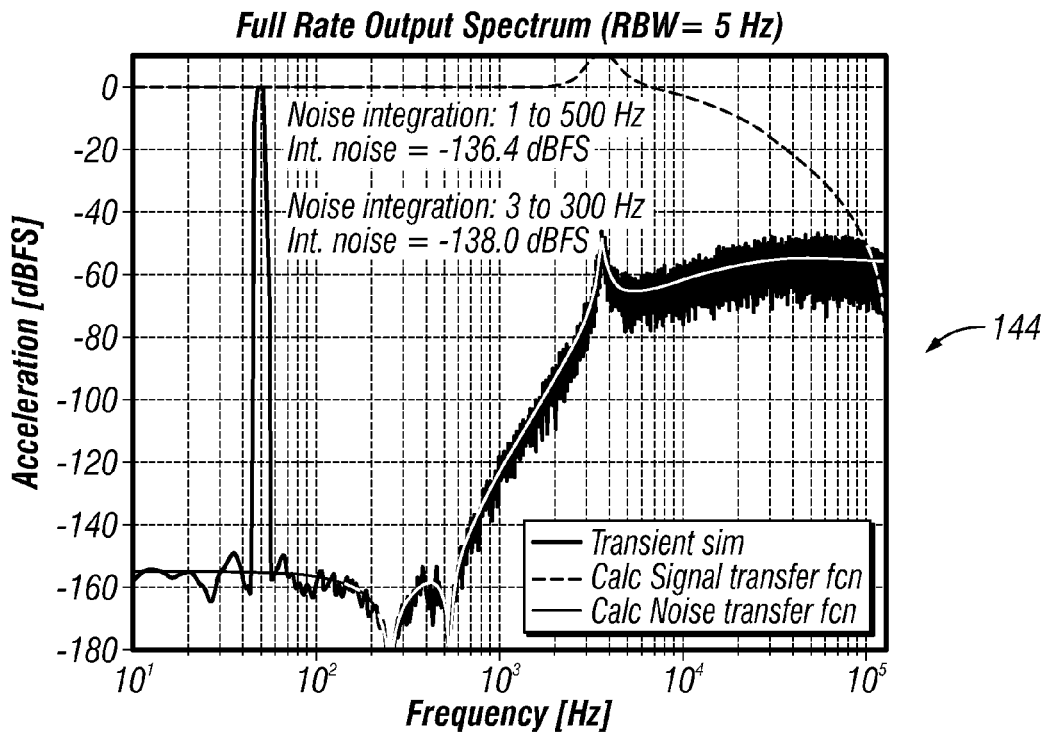
FIG. 12 is a schematic view of a spectrum of transient simulation when the sensor resonance frequency has been reduced to 530 Hz without changing any other system parameters.
Figure 13:
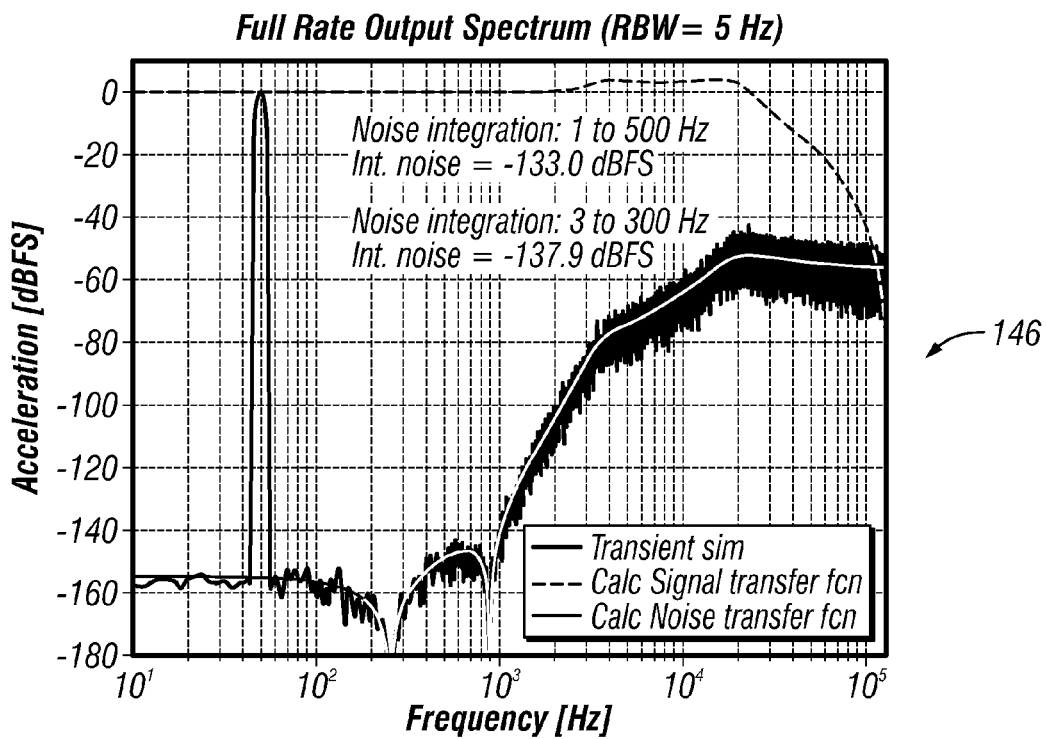
FIG. 13 is a schematic view of a spectrum of transient simulation when a sensor resonance frequency has been increased to 880 Hz without changing any other system parameters.

The system's sensitivity to parameter variations has also been analyzed and taken into account during optimization of the loop filter coefficients. The robustness of the system is greatly enhanced by the secondary feedback loop that is an essential part of the invention. Transient simulations prove that the system of the present invention can handle a sensor element resonance frequency shift down to 530 Hz (best seen in FIG. 12) and up to 880 Hz (best seen in FIG. 13) before it becomes unstable. More particularly, FIG. 11 shows a resulting spectrum 142 of a transient simulation with 18 nV/√Hz white noise, 1% (3σ) mismatch and data weighted averaging to mitigate the mismatch. FIG. 12 is a schematic view a spectrum 144 of transient simulation when the sensor resonance frequency has been reduced to 530 Hz without changing any other system parameters. FIG. 13 shows a schematic view a spectrum 146 of transient simulation when a sensor resonance frequency has been increased to 880 Hz without changing any other system parameters.

While the present invention has been described in accordance with preferred compositions and embodiments, it is to be understood that certain substitutions and alterations may be made thereto without departing from the spirit and scope of the following claims.

The invention claimed is:

1. A method, comprising:
sending, from a sensor element to a modulator, a signal indicating a sensing detection, wherein the sensor element includes a plurality of electrodes, and wherein the modulator includes a single-bit quantizer electrically connected to a digital accumulator;
sending, from the single-bit quantizer to the digital accumulator, output information corresponding to the signal;
converting, by the digital accumulator, the output information to a multi-bit feedback signal;
sending, from the digital accumulator to the sensor element, the multi-bit feedback signal in a first feedback loop; and
sending, from the single-bit quantizer to the modulator, a single-bit feedback signal in a second feedback loop.

2. The method of claim 1, further comprising:
detecting, by the sensor element, forces at the proof mass.

3. The method of claim 1, further comprising:
providing, by the sensor element, the multi-bit feedback signal to one or more pairs of the plurality of electrodes, wherein the multi-bit feedback signal is usable by the sensor element to control one or more voltages of the one or more pairs.

4. The method of claim 1, further comprising:
adjusting, by the one or more pairs of the plurality of electrodes, the position of a proof mass.

5. The method of claim 1, wherein sending the single-bit feedback signal in the second feedback loop to the modulator further comprises sending the single-bit feedback signal to an electrical filter.

6. The method of claim 1, further comprising:
sensing, by the sensing element, a position of a proof mass.

7. The method of claim 1, further, wherein the sensor element further comprises a digital-to-analog converter including pairs of the plurality of electrodes and carriers disposed proximate to the proof mass, wherein the multi-bit signal is usable by the one or more pairs of electrodes to generate mechanical forces.

8. An apparatus, comprising:
a sensor including a proof mass; and
a modulator including a digital filter, a single-bit quantizer, and a bit accumulator;
wherein the sensor is configured to provide a proof mass indication to the modulator; and
wherein the modulator is configured to:
send, by the single-bit quantizer, a single-bit feedback to the digital filter;
process, by the bit accumulator, an output of the single-bit quantizer; and
send, by the bit accumulator, a multi-bit feedback to the sensor.

9. The apparatus of claim 8,
wherein the modulator is further configured to quantize, by the single-bit quantizer, an output of the digital filter.

10. The method of claim 1 further comprising:
sensing, by the sensor element, pressure variations.

11. The apparatus of claim 8, wherein the sensor further comprises opposing structures disposed on either side of the proof mass, the opposing structures including one or more pairs of electrodes disposed thereon; and
wherein the modulator is further configured to transform, by the bit accumulator, the output of the single bit quantizer to a multi-bit signal, wherein the multi-bit signal is usable by the one or more pairs of electrodes to adjust one or more voltages.

12. The apparatus of claim 11, wherein the opposing structures are glass, wherein the proof mass is a common electrode, and wherein the common electrode detects the proof mass indication.

13. The apparatus of claim 11, wherein the proof mass indication is an electrostatic force, wherein each electrode of the one or more pairs of electrodes and the proof mass form capacitances, and wherein the multi-bit signal is usable by the apparatus to control the capacitances.

14. An apparatus, comprising:
a sensor with an electrode, wherein the electrode is configured to provide a sensing indication;
a circuit configured to receive the sensing indication from the sensor, the circuit comprising:
a filter;
a single-bit quantizer configured to provide a single-bit feedback to the filter; and
a digital accumulator configured to provide a multi-bit feedback to the sensor.

15. The apparatus of claim 14, wherein the single-bit quantizer is configured to provide the single-bit feedback via one or more feedback lines.

16. The apparatus of claim 14, wherein the single-bit quantizer is further configured to receive an output from the filter, and wherein the digital accumulator is further configured to receive an output from the single-bit quantizer.

17. The apparatus of claim 14, wherein the digital accumulator is configured to convert a single-bit output from the single-bit quantizer to a multi-bit signal, wherein the multi-bit signal is usable to provide the multi-bit feedback.

18. The apparatus of claim 17, wherein the digital accumulator is further configured to digitally integrate the single-bit output.

19. The apparatus of claim 14,
wherein the single-bit quantizer being configured to provide the single-bit feedback to the filter includes the single-bit quantizer being configured to process the single-bit feedback;
wherein the digital accumulator being configured to provide the multi-bit feedback to the sensor includes the digital accumulator being configured to process the multi-bit feedback; and
wherein processing the single-bit feedback requires less time than processing the multi-bit feedback.

20. The apparatus of claim 14, further comprising:
one or more support structures distributed within the sensor;
a plurality of electrodes distributed within the sensor on the one or more structures, wherein each of the plurality of electrodes together with the electrode form a corresponding plurality of capacitors, wherein the electrode is a proof mass, wherein the plurality of capacitors are configured to indicate a directional parameter of the proof mass;
wherein a pair of the plurality of electrodes is configured to receive the multi-bit feedback.

* * * * *